United States Patent
Kriebernegg et al.

(10) Patent No.: US 11,294,034 B2
(45) Date of Patent: Apr. 5, 2022

(54) PROXIMITY SENSOR WITH CROSSTALK COMPENSATION

(71) Applicant: ams AG, Premstaetten (AT)

(72) Inventors: Josef Kriebernegg, Premstaetten (AT); Chandra Nyshadham, Premstaetten (AT); Rahul Thottathil, Premstaetten (AT); Hafeez Koonari Thoombath, Premstaetten (AT)

(73) Assignee: AMS AG, Premstaetten (AT)

( * ) Notice: Subject to any disclaimer, the term of this patent is extended or adjusted under 35 U.S.C. 154(b) by 169 days.

(21) Appl. No.: 16/628,330

(22) PCT Filed: Jun. 12, 2018

(86) PCT No.: PCT/EP2018/065476
§ 371 (c)(1),
(2) Date: Jan. 3, 2020

(87) PCT Pub. No.: WO2019/007644
PCT Pub. Date: Jan. 10, 2019

(65) Prior Publication Data
US 2020/0150230 A1 May 14, 2020

(30) Foreign Application Priority Data
Jul. 5, 2017 (EP) .................................... 17179779

(51) Int. Cl.
*G01C 3/08* (2006.01)
*G01S 7/48* (2006.01)
*G01S 17/46* (2006.01)

(52) U.S. Cl.
CPC ............ *G01S 7/4804* (2013.01); *G01S 17/46* (2013.01)

(58) Field of Classification Search
None
See application file for complete search history.

(56) References Cited

U.S. PATENT DOCUMENTS

| | | | |
|---|---|---|---|
| 2010/0264301 A1* | 10/2010 | Borosak | G01S 7/4804 250/252.1 |
| 2013/0120761 A1 | 5/2013 | Dyer et al. | |
| 2017/0122863 A1 | 5/2017 | Tan et al. | |

FOREIGN PATENT DOCUMENTS

| CN | 102611421 A | * 7/2019 | ........... H03K 17/941 |
|---|---|---|---|
| EP | 2863192 | 4/2015 | |

(Continued)

OTHER PUBLICATIONS

European Patent Office, International Search Report for PCT/EP2018/065476 dated Aug. 16, 2018.

*Primary Examiner* — Mark Hellner
(74) *Attorney, Agent, or Firm* — MH2 Technology Law Group LLP

(57) ABSTRACT

A proximity sensor (1) with crosstalk compensation comprises a transmitting circuit (10) to transmit a signal to be reflected at a target (2) and a disturbing object (3), and a receiving circuit (20) to receive a reflected signal (RS) having a useful component (RS1) and a noise component (RS2). The receiving circuit (20) comprises an output node (A20) to provide an output signal (Vout2) in dependence from the distance of the proximity sensor (1) from the target (2). The receiving circuit (20) comprises a crosstalk compensation circuit (100) comprising a first charging circuit (110) to provide a first charge for for coarse crosstalk compensation and a second charging circuit (120) to provide a second charge for fine crosstalk compensation. A control circuit (30) sets an amount of the first and the second charge so that the output signal (Vout2) of the crosstalk compensation circuit (100) is dependent on the useful component (RS1) and independent on the noise component (RS2) of the reflected signal (RS).

15 Claims, 4 Drawing Sheets

(56) References Cited

FOREIGN PATENT DOCUMENTS

| TW | 201333512 A | 8/2013 |
| TW | 201643467 A | 12/2016 |

\* cited by examiner

PROXIMITY SENSOR WITH CROSSTALK COMPENSATION

TECHNICAL FIELD

The disclosure relates to a proximity sensor to detect a target in the environment of the proximity sensor, wherein the sensor is configured to perform a crosstalk compensation.

BACKGROUND

A proximity sensor is used to detect the existence of a target in the environment of the proximity sensor and/or the distance between the target and the proximity sensor. In the case when the proximity sensor is configured as an optical sensor, an optical signal, for example pulses of IR(infrared) light may be emitted by a light source of a transmitting circuit of the sensor towards the target. The emitted light signal is reflected at the target and received at a receiving circuit of the proximity sensor. The receiving circuit is configured to evaluate the detected optical signal after reflection at the target and to determine the existence of the target and/or the distance between the proximity sensor and the target.

A proximity sensor system may comprise an IR light-emitting diode coupled to a driver. The driver drives the IR light-emitting diode to generate periodic IR pulses, synchronously to the receiving circuit, for example a proximity modulator sub-system. In the presence of a target or an obstruction, some of the pulse energy is reflected back to cause a similar pulsed photo current profile in an IR photodiode used in the receiving circuit as an optical detector.

The reflected energy may be measured by evaluating the photo current and translating it into a corresponding output signal, for example an output voltage, by the receiving circuit. The output voltage thus generated is measured and converted into a digital output by an analog-to-digital circuit (ADC) for further manipulation by any backend processing unit. The presence of a target and the distance between the target and the proximity sensor can be extracted as a function of the ADC output data which represents the reflected signal intensity.

The emitted optical signal is usually not only reflected at a target but also at a disturbing object. Thus, the reflected optical signal does not only have a useful component. In the normal case, the reflected optical signal very often has some unwanted/noise optical reflection component caused by the reflection of the emitted optical signal at the disturbing object in addition to the useful optical reflection component that is caused by the reflection of the emitted optical signal at the target. The unwanted optical reflection component or noise component will be termed as optical crosstalk hereafter.

An optical proximity sensor may be used in a mobile phone to detect the existence of/distance to a target, for example a user's head/ear. In this case the transmitting circuit of the proximity sensor emits an optical signal to the target, for example the user's head/ear. The receiving circuit of the proximity sensor detects the optical signal reflected at the target, in particular the head/ear of the user, to detect the presence of the user's head/ear and, in particular, the distance of the mobile phone to the user. If the proximity to a target is detected, some operational parameters of the mobile phone are changed in accordance to the detected scenario. As an example, the light intensity of the display of the mobile phone may be switched off or reduced to save power, if the proximity sensor included in the mobile phone detects the proximity of a user to the mobile phone, for example the presence of a user's ear to which the mobile phone is pressed during a telephone call.

Referring to the example of use of the proximity sensor in the mobile phone, a crosstalk component of the reflected optical signal is generated from the reflection of the transmitted optical signal, for example an IR LED pulse energy, at the package of the mobile phone, the reflecting mobile phone glass, etc. This unwanted/noise component of the reflected optical signal has to be compensated, in order to extract and convert the received energy reflected from the target.

There is a need to provide a proximity sensor that allows crosstalk compensation for an extended range while maintaining high resolution.

SUMMARY

An embodiment of a proximity sensor with crosstalk compensation is specified in claim 1.

The proximity sensor comprises a transmitting circuit to transmit a signal to be reflected at a target and a disturbing object. The proximity sensor further comprises a receiving circuit to receive a reflected signal having a useful component and a noise component. The receiving circuit comprises an output node to provide an output signal in dependence from the distance of the proximity sensor from the target. The receiving circuit further comprises a signal node to apply an evaluation signal being generated by the receiving circuit in dependence on the reflected signal.

The receiving circuit further comprises a crosstalk compensation circuit to generate the output signal. The crosstalk compensation circuit is coupled to the signal node. The crosstalk compensation circuit comprises a first charging circuit to provide a first charge and a second charging circuit to provide a second charge. The first and the second charge are applied to the signal node. The proximity sensor further comprises a control circuit to control the first and the second charging circuit to set an amount of the first and the second charge so that the output signal of the crosstalk compensation circuit is dependent on the useful component and independent on the noise component of the reflected signal.

The proximity sensor allows to measure the amount of optical crosstalk by estimating the energy of an optical signal reflected at the disturbing object in the absence of the target. When the optical signal is generated by a pulsed IR LED, the amount of optical crosstalk can be measured by estimating the IR LED pulse energy reflected at the disturbing object in the absence of the target. The proximity sensor provides an extended crosstalk compensation methodology that uses the first charging circuit for coarse crosstalk compensation, whilst a fine crosstalk residue is cancelled out by using the second charging circuit.

The second charging circuit may be configured as an offset adjustment circuit for an operational amplifier of the proximity sensor. This means that the fine crosstalk compensation may be performed by using an offset strategy of an operational amplifier. The outcome of the presented solution is a very wide crosstalk compensation range while still keeping a very fine resolution.

The proximity sensor may be used as a component in a mobile phone for the cancellation or compensation of increased optical crosstalk for proximity sensing such as needed, for example, for no-hole mobile applications while still keeping the fine crosstalk compensation resolution.

Additional features and advantages are set forth in the detailed description that follows and in part will be readily apparent to those skilled in the art from the description or recognized by practising the embodiments as described in the written description and claims hereof, as well as the appended drawings. It is to be understood that both the foregoing general description and the following detailed description are merely exemplary, and are intended to provide an overview or framework to understand the nature and character of the claims.

BRIEF DESCRIPTION OF THE DRAWINGS

The accompanying drawings are included to provide further understanding, and are incorporated in and constitute a part of the specification. The drawings illustrate one or more embodiments, and together with the detailed description serve to explain principles and operation of the various embodiments. As such, the disclosure will become more fully understood from the following detailed description, taken in conjunction with the accompanying figures in which.

DETAILED DESCRIPTION

Figure 1:
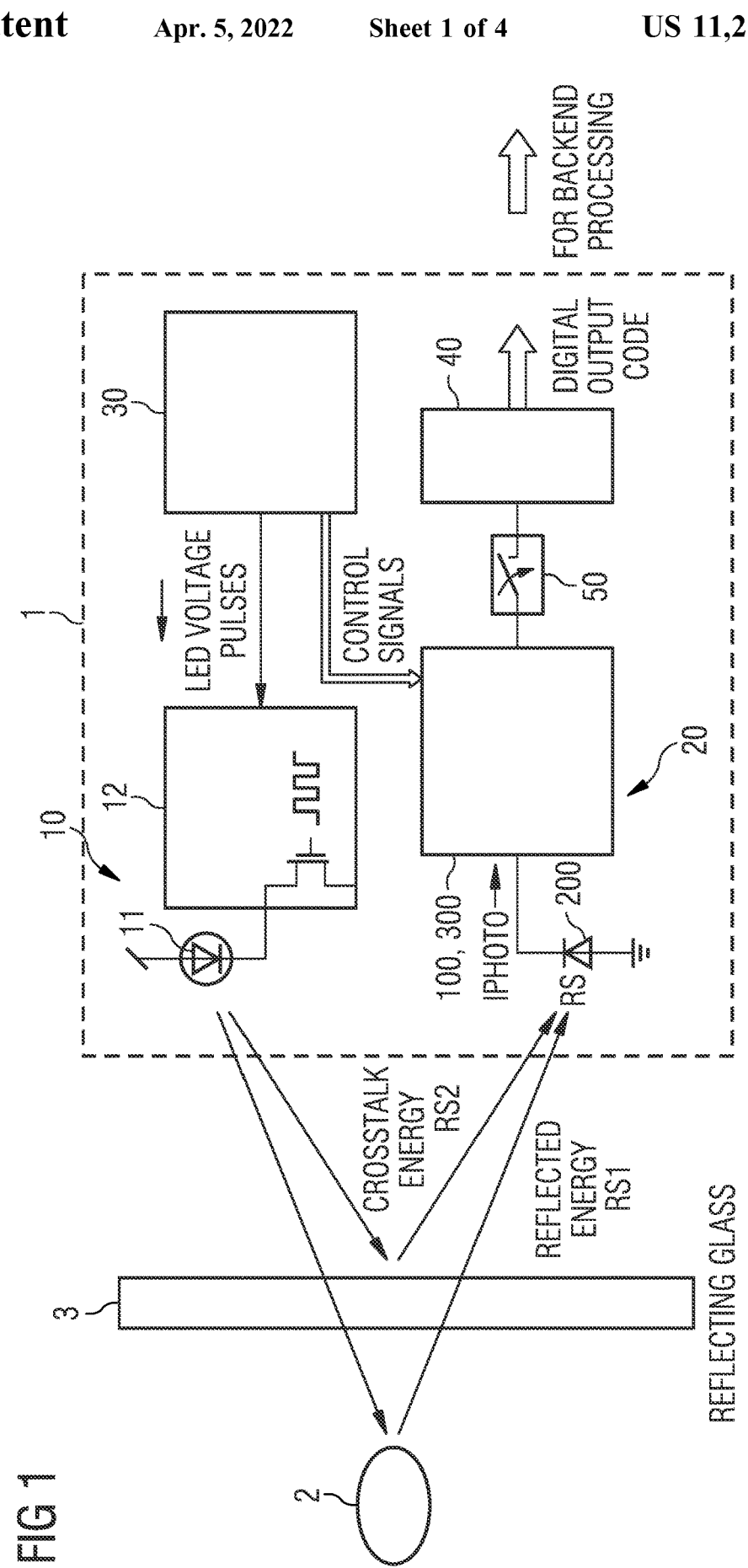
FIG. 1 shows an embodiment of a proximity sensor to detect the existence of a target and/or to determine a distance between the proximity sensor system and the target.

FIG. 1 shows an embodiment of a proximity sensor system/module 1 that may be used in a mobile phone to detect the existence of a target 2 and/or the distance between the proximity sensor 1 and the target 2. The proximity sensor 1 comprises a transmitting circuit 10 to transmit a signal, for example an optical signal, towards the target 2. In the case that the proximity sensor 1 is included in a mobile phone, the target 2 may be a head or an ear of a person who uses the mobile phone for a telephone call.

The transmitting circuit 10 comprises an optical emitter 11 that is activated by a driver circuit 12. The optical emitter 11 may be configured as an IR LED being coupled to an LED driver 12 to generate optical light pulses that are directed towards the object 2. The driver circuit 12 may be controlled by a control circuit 30 that may control the driver circuit 12 by appropriate control signals. When the control circuit 30 controls the driver circuit 12 by LED voltage pulses, the IR LED sends out pulses of IR light towards the target 2.

The transmitted optical signal may have a first component that hits the target 2 and is reflected at the target 2. The transmitted optical signal may further have a second component that is emitted towards and reflected by a disturbing object 3, for example a reflecting glass or package of a mobile phone, etc.

After reflection at the target 2 and the disturbing object 3, the reflected optical signal RS is received at a receiving circuit 20 of the proximity sensor 1. The reflected optical signal RS has a useful component RS1 that comes from the reflection of the transmitted optical signal at the target 2, and a disturbing/noise component RS2 that comes from the reflection of the transmitted optical signal at the disturbing object 3.

The receiving circuit 20 comprises an optical detector 200 to receive/detect the reflected optical signal and an evaluation circuit 300 to evaluate the received optical signal and output an output signal that carries information about the presence of the target 2 and/or the distance between the proximity sensor 1 and the target 2. The output signal may be an analog voltage that may be transferred by a controllable switch 50 to an analog-to-digital converter 40. The analog-to-digital converter 40 outputs a digital code that may be used for backend processing.

The optical detector 200 may be configured as an IR photodiode to detect the optical signal/optical energy that hits the optical detector 200 after reflection. The useful component RS1 and the noise component RS2 of the reflected optical signal are detected by the detection circuit 200 and translated into a photo current IPHOTO that is applied to the evaluation circuit 300. The evaluation circuit 300 may be configured as a proximity modulator/integrator to output an evaluation signal in dependence on the detected reflected signal RS. The evaluation circuit 300 is configured to measure the reflected energy by integrating the photo current IPHOTO and translating it into an evaluation signal. The evaluation signal may be a voltage that is dependent on the energy of the detected signal RS.

Due to the interference of the useful component/reflected energy RS1 and the noise component/crosstalk energy RS2 of the reflected optical signal at the position of the optical detector 200, the evaluation signal provided by the evaluation circuit 300 comprises a useful component that contains information about the presence of the target 2 or the distance between the target 2 and the proximity sensor, and a noise component that distorts the useful component of the output signal so that the detection of the object 2 and/or the evaluated distance between the proximity sensor 1 and the target 2 is often inaccurate.

Figure 2:
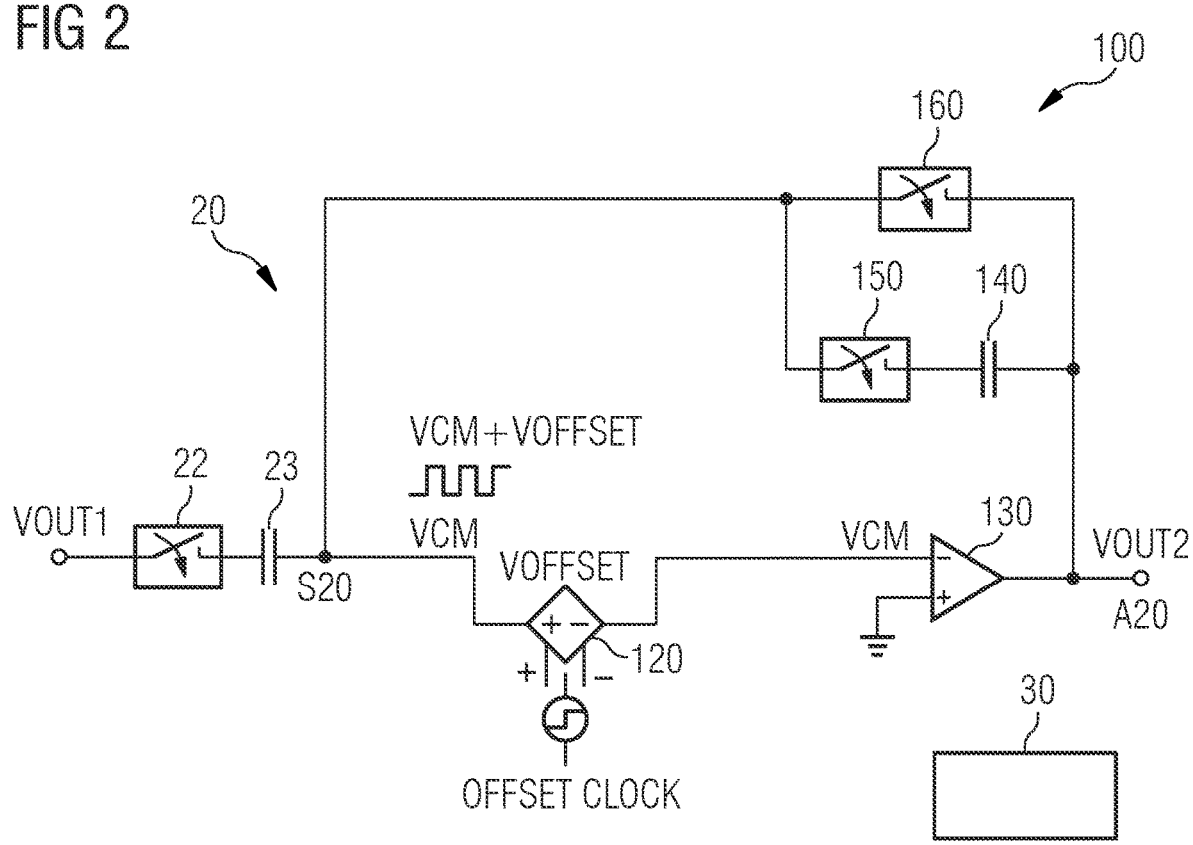
FIG. 2 shows an embodiment of a crosstalk compensation circuit of a receiving circuit of a proximity sensor.

In order to compensate the noise/crosstalk component RS2 of the reflected signal RS, the receiving circuit 20 comprises a crosstalk compensation circuit 100. FIG. 2 shows an embodiment of a portion of the receiving circuit 20 comprising a possible embodiment of the crosstalk compensation circuit 100. The receiving circuit 20 comprises a signal node S20 to receive the evaluation signal Vout1 that is generated by the evaluation circuit 300 shown in FIG. 1.

The evaluation signal Vout1 may be applied via a controllable switch 22 and a sampling capacitor 23 to the signal node S20. The crosstalk compensation circuit 100 may comprise an operational amplifier 130 having an input side to apply a composite input signal VCM. The input signal VCM is applied to an input node, for example an inverting input node, of the operational amplifier 130. A non-inverting input node of the operational amplifier 130 is connected to ground. The composite input signal VCM comprises the component of the evaluation signal Vout1 and a signal component VOFFSET.

The signal component VOFFSET is generated by a charging circuit 120 of the crosstalk compensation circuit 100. The charging circuit 120 may be configured as an offset adjustment circuit to adjust the offset voltage of the operational amplifier 130. The charging circuit 120 is controlled by a control signal, for example an offset clock signal, that may be generated by the control circuit 30. The charging circuit 120 may be configured as an internal or external offset adjustment circuit.

FIG. 2 shows pulses of the composite input signal VCM that are applied to one of the input nodes, for example the inverting input node, of the operational amplifier 130. The operational amplifier 130 has an output side being coupled to an output node A20 of the receiving circuit 20 to output an output signal Vout2. The crosstalk compensation circuit 100 comprises a feedback path that includes a feedback capacitor 140. The feedback capacitor 140 may be coupled to the signal node S20 via a controllable switch 150. Furthermore, the output node A20 of the receiving circuit 20 may be directly connected to the signal node S20 via a controllable switch 160. The controllable switches 22, 150 and 160 as well as the charging circuit 120 may be controlled by the controller 30.

The amount of optical crosstalk can be measured by means of the crosstalk compensation circuit 100 shown in FIG. 2. To this purpose, the crosstalk compensation circuit 100 estimates the reflected noise component RS2 of the reflected signal RS in the absence of the target 2, for example by estimating the IR LED pulse energy reflected in the absence of the target 2, but in the presence of the disturbing object 3.

To compensate the crosstalk energy, the compensation circuit 100 uses the charging circuit 120 to provide the adjustable offset voltage VOFFSET for the operational amplifier 130. The evaluation signal Vout1 represents the reflected energy achieved by integrating the photo current IPHOTO by means of the evaluation circuit 300. Without any target 2, the evaluation signal Vout1 equals the optical crosstalk voltage.

In order to provide a crosstalk compensation, the portion of the receiving circuit 20 shown in FIG. 2 is operated in two operational time phases. During these first and second operational phases, no target 2 is existing. Only the disturbing object 3 is present so that the reflected optical signal/light only comprises the noise component RS2.

In the first operational phase, the controllable switch 160 is closed, i.e. switched in the conductive state, and the controllable switch 150 is operated in the opened state, i.e. is operated in the non-conductive state. The operational amplifier 130 acts as a follower with no offset voltage of the operational amplifier. This means that the charging circuit 120 is deactivated so that the offset voltage VOFFSET is set to 0 V. By closing the controllable switch 22, i.e. turning the controllable switch 22 in the conductive state, the evaluation signal, for example the crosstalk voltage, Vout1 will be stored at the sampling capacitor 23. After the charge transfer into the sampling capacitor 23 has been finished, the controllable switches 22 and 160 are operated again in the non-conductive/opened state.

In the subsequent second operational phase, the controllable switch 150 is turned in the closed state, i.e. in the conductive state, and the controllable switch 160 is operated in the opened state, i.e. the non-conductive state. Furthermore, the charging circuit 120 is activated to generate the offset voltage VOFFSET. By now closing the controllable switch 22, i.e. turning the controllable switch 22 in the conductive state, the input voltage/crosstalk voltage Vout1 minus the offset voltage VOFFSET will be transferred to the integration/feedback capacitor 140. The offset voltage VOFFSET is set by the control circuit 30 during the second operational phase such that the offset voltage VOFFSET is equal to the evaluation voltage Vout1 and the output signal is equal to the zero level, for example equal to 0 V. In consequence, the complete crosstalk will be cancelled out and no crosstalk charge will be transferred into the integration/feedback capacitor 140 anymore.

The maximum output equivalent crosstalk voltage Vout2 that can be cancelled by the above discussed methodology of the circuit configuration shown in FIG. 2, is VOFFSET*CS/CF, wherein VOFFSET is the offset voltage set by the charging circuit 120, CS is the capacitance of the sampling capacitor 23 and CF is the capacitance of the feedback/integrating capacitor 140. The maximum output equivalent crosstalk voltage Vout2 is limited by the maximum offset voltage VOFFSET of the charging circuit 120, for example the offset adjustment circuit of the operational amplifier 130, feasible from maintaining proper functional performance. The level of the offset voltage VOFFSET of the charging circuit 120 can be adjusted with very fine steps so that a very good crosstalk compensation resolution can be achieved. However, as explained above, the overall crosstalk compensation range is limited to the maximum adjustable offset range provided by the charging circuit/offset adjustment circuit 120 of the operational amplifier 130.

In conclusion, the circuit shown in FIG. 2 supports a crosstalk compensation range with fine resolution. The circuit configuration of the receiving circuit of the proximity sensor shown in FIG. 2 may be used in a mobile phone, wherein optical signals are emitted by a transmitting circuit and received by a receiving circuit through holes being provided in the casing/package of the mobile phone. However, the crosstalk compensation range of the circuit configuration shown in FIG. 2 may often not be wide enough, for example when the circuit configuration of FIG. 2 would be used in no-hole proximity sensor applications with very strong crosstalk. An example for a no-hole proximity sensor application is a mobile phone including the proximity sensor, wherein the optical signals are not emitted/received through holes provided in the casing of the mobile phone. The holes are rather closed, for example by using a closed casing/package or by filling the holes of the casing/package of the mobile phone with ink.

Figure 3:
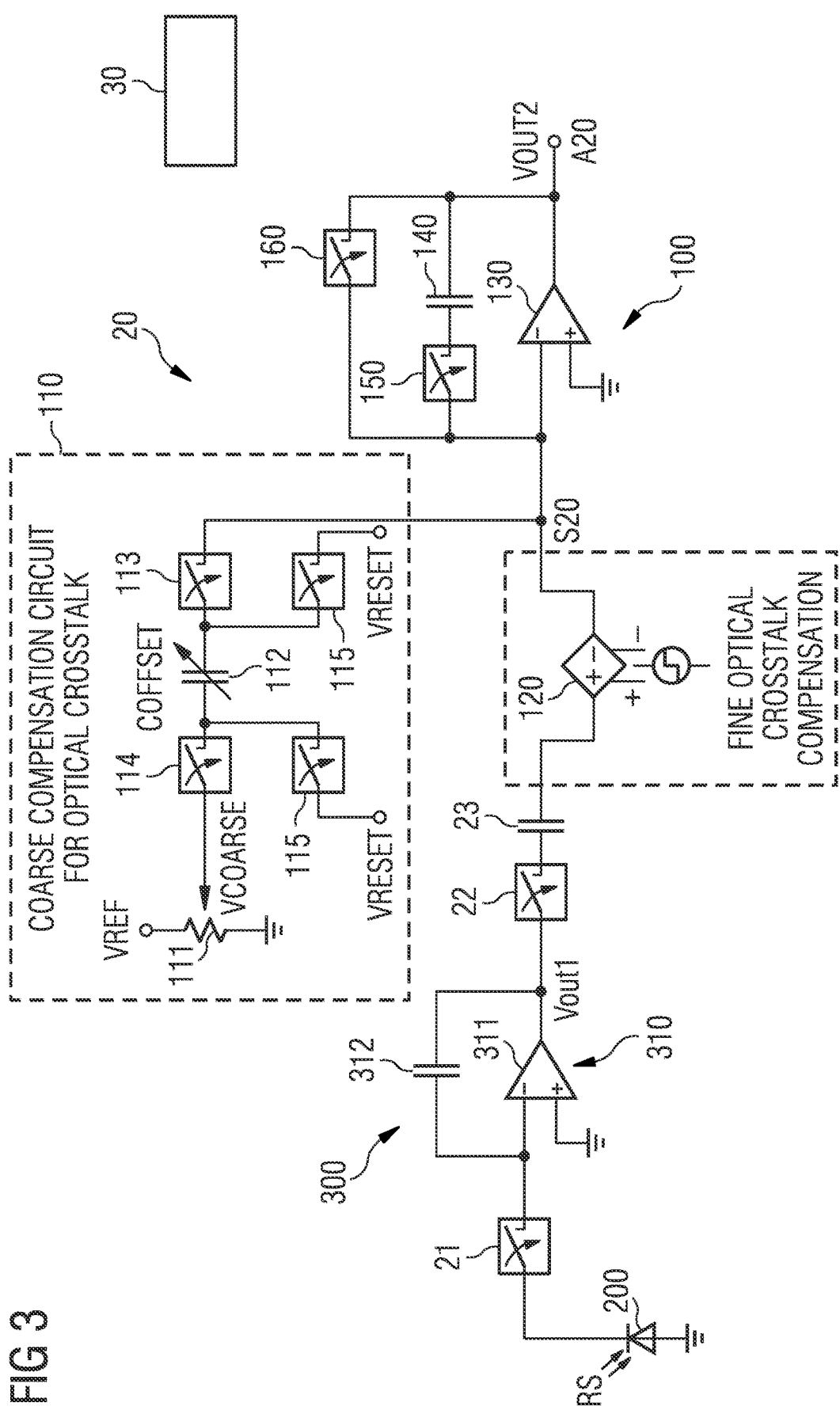
FIG. 3 shows an embodiment of a receiving circuit of a proximity sensor with crosstalk compensation in an extended range while maintaining high resolution.
Figure 4:
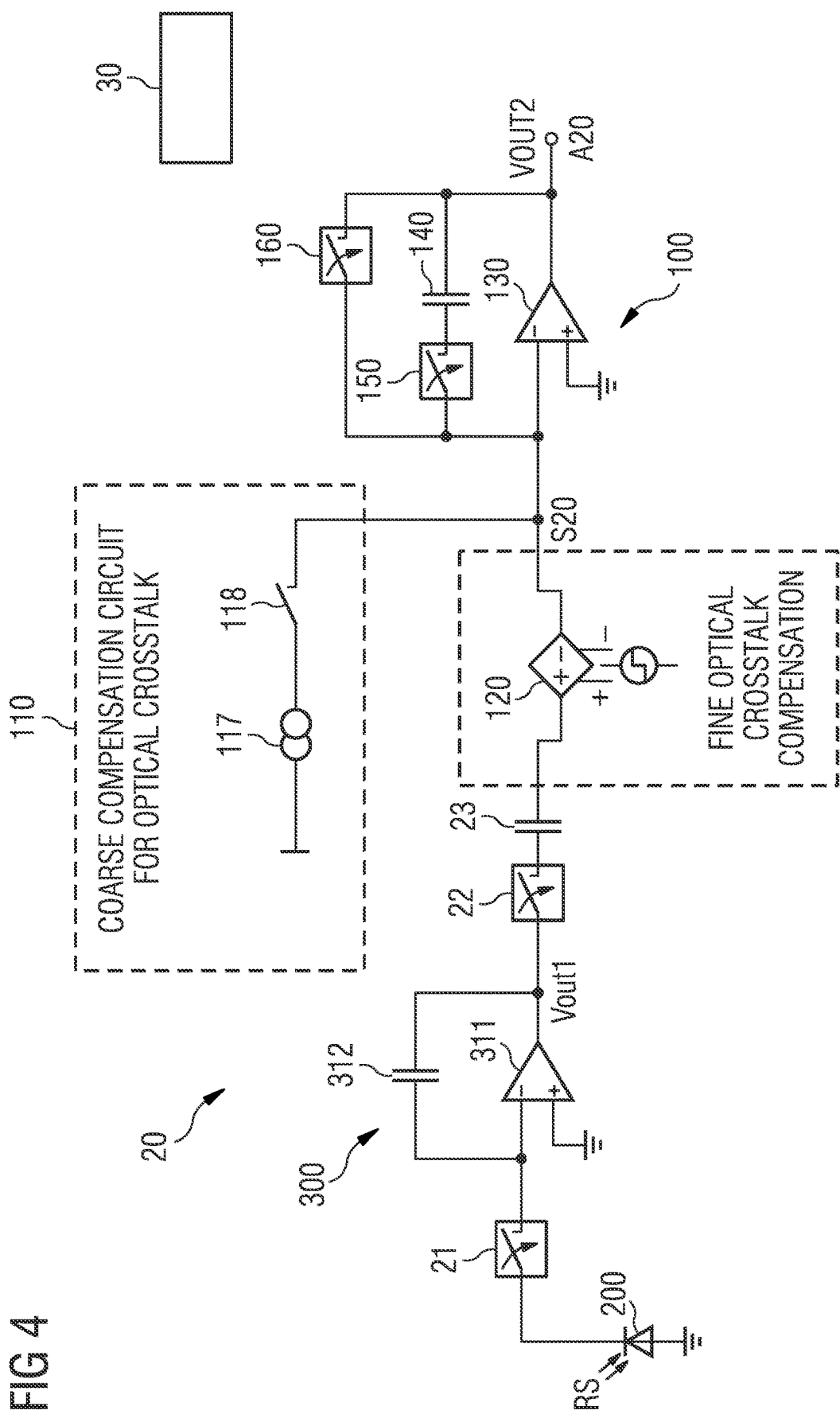
FIG. 4 shows another embodiment of a receiving circuit of a proximity sensor with crosstalk compensation in an extended range while maintaining high resolution.

FIGS. 3 and 4 respectively show an embodiment of a receiving circuit 20 comprising a crosstalk compensation circuit 100 including coarse crosstalk compensation being realized by a charging circuit 110 in cooperation with fine crosstalk compensation being realized by the charging circuit 120.

Referring to FIG. 3, the proximity sensor 1 comprises the transmitting circuit 10 to transmit a signal to be reflected at a target 2 and a disturbing object 3, as shown in FIG. 1. The proximity sensor 1 further comprises a receiving circuit 20 to receive the reflected signal RS having a useful component RS1 and a noise component RS2, as illustrated in FIG. 1. The receiving circuit 20 comprises an output node A20 to provide an output signal Vout2 in dependence on the distance of the proximity sensor 1 from the target 2. The receiving circuit 20 further comprises a signal node S20 to apply an evaluation signal Vout1, wherein the evaluation signal Vout1 is generated by the receiving circuit 20, in particular by the evaluation circuit 300, in dependence on the reflected signal RS. The receiving circuit 20 further comprises a crosstalk compensation circuit 100 to generate the output signal Vout2. The crosstalk compensation circuit 100 is coupled to the signal node S20.

The crosstalk compensation circuit 100 comprises the charging circuit 110 to provide a first charge and the charging circuit 120 to provide a second charge. The first and the second charges are applied to the signal node S20. The proximity sensor 1 further comprises a control circuit 30, as shown in FIG. 1, to control the charging circuit 110 and the charging circuit 120 to set an amount of the first and the second charges so that the output signal Vout2 of the receiving circuit 100 is only dependent on the useful component RS1 and independent on the noise component RS2 of the reflected signal RS.

The receiving circuit 20, i.e. the evaluation circuit 300 of the receiving circuit 20, is configured to generate the evaluation signal Vout1 with a first component being dependent on the useful component RS1 of the reflected signal RS and with a second component being dependent on the noise component RS2 of the reflected signal RS. The control circuit 30 controls the charging circuit 110 and the charging circuit 120 such that a sum of the amount of the first and the second charges applied to the signal node S20 compensates the second component of the evaluation signal Vout1. The crosstalk compensation circuit 100 is configured to generate the output signal Vout2 dependent on the first component of the evaluation signal Vout1, i.e. the useful component of the evaluation signal Vout1, and independent on the second component, i.e. the noise component, of the evaluation signal Vout1.

The crosstalk compensation circuit 100 comprises an operational amplifier 130 having an input side being coupled to the signal node S20 and an output side being coupled to the output node A20 of the receiving circuit 20. The crosstalk compensation circuit 100 further comprises a feedback capacitor 140 being disposed in a feedback path between the output side and the input side of the operational amplifier 130.

The crosstalk compensation circuit 100 further comprises a first controllable switch 150 being arranged in the feedback path between the feedback capacitor 140 and the input side of the operational amplifier 130. The crosstalk compensation circuit 100 further comprises a controllable switch 160 being arranged in an additional feedback path between the input side and the output side of the operational amplifier 130.

The charging circuit 110 comprises a potentiometer 111 and a storage capacitor 112. The potentiometer 111 is arranged between a reference potential Vref and a ground potential. The storage capacitor 112 is charged by the amount of the first charge, wherein the amount of the first charge is dependent on a voltage drop VCOARSE set at the potentiometer 111. In particular the control 30 is configured to set the voltage drop VCOARSE of the potentiometer 111. The storage capacitor 112 may have a variable capacitance COFFSET. The control circuit 30 is configured to set the variable capacitance COFFSET of the storage capacitor 112.

The charging circuit 110 comprises a controllable switch 113 to couple the storage capacitor 112 of the charging circuit 110 to the signal node S20. Furthermore, the charging circuit 110 comprises a controllable switch 114 to couple the storage capacitor 112 to the potentiometer 111. As shown in FIG. 3, both sides of the storage capacitor 112 may be connected to a voltage VRESET to reset the storage capacitor by means of controllable switches 115.

The charging circuit 120, which is also coupled to the signal node S20, may be configured as an offset adjustment circuit for the operational amplifier 130, as explained with reference to FIG. 2.

The receiving circuit 20 may comprise a detection circuit 200 to detect the reflected signal RS. The detection circuit 200 may be an IR photodiode to receive IR light reflected at the target 2 and the disturbing object 3. The detection circuit 200 may generate the photo current IPHOTO in dependence on the detected signal RS. The receiving circuit 20 further comprises an evaluation circuit 300 to generate the evaluation signal Vout1 in dependence on the reflected signal RS or the photo current IPHOTO.

The evaluation circuit 300 may comprise an integrator circuit 310 having an input side being coupled to the detection circuit 200 to receive the detected reflected signal and an output side to generate the evaluation signal Vout1. The integrator circuit 310 may comprise an operational amplifier 311 and an integrating capacitor 312 being arranged in a feedback path between the input side and the output side of the operational amplifier 311. The receiving circuit 20 comprises a controllable switch 21 that is arranged between the detection circuit 200 and the evaluation circuit 300. The receiving circuit 20 further comprises a controllable switch 22 being disposed between the output side of the integrator circuit 310 and the signal node S20 to provide the evaluation signal Vout1 to the signal node S20. Similar as shown in FIG. 2, a sampling capacitor 23 is arranged at the output side of the integrator 300 to sample the voltage of the evaluation signal Vout1.

The circuit configuration of the receiving circuit 20 shown in FIG. 3 allows to perform an extended crosstalk compensation methodology compared to the solution shown in FIG. 2. According to the embodiment of the receiving circuit 20 shown in FIG. 3, an additional charging circuit 110 is used for coarse crosstalk compensation, whilst the fine crosstalk residue is still cancelled out by using the operational amplifier offset strategy realized by the charging circuit 120, as described with reference to the circuit configuration of FIG. 2. In particular, the charging circuit 110 is configured to provide the amount of the first charge being higher than the amount of the charge provided by the second charging circuit 120. The outcome of the solution shown in FIG. 3 is then a very wide crosstalk compensation range while still keeping a very fine resolution.

In order to perform the crosstalk compensation by means of the crosstalk compensation circuit 100 shown in FIG. 3, the receiving circuit 20 is operated in two operational phases. When operated in the first and second operational phase it has been assured that the target 2 is removed so that the reflected optical signal RS has only the noise component RS2 which results from a reflection of the emitted optical signal at the disturbing object 3.

In the first operational phase, the controllable switch 160 is closed, i.e. operated in a conductive state, and the controllable switch 150 is operated in the open state, i.e. turned in a non-conductive state. The operational amplifier 130 acts as a follower with no offset voltage, which means that the charging circuit 120 is deactivated so that the offset voltage VOFFSET is set to the zero level, for example to 0 V. Then, the controllable switch 22 is closed, i.e. turned in the conductive state, so that the crosstalk voltage of the evaluation signal Vout1 will be stored at the sampling capacitor 23. After the charge transfer into the sampling capacitor 23 has been finished, the controllable switches 22 and 160 are turned again in the open/non-conductive state.

The subsequent second operational phase comprises a first cycle and a second cycle. The first cycle is used to perform a coarse crosstalk compensation, while the fine crosstalk compensation is performed during a subsequent second cycle of the second operational phase. Before starting the second operational phase the storage capacitor 112 is connected with both of its plates to the potential VRESET by operating the controllable switches 115 in the conductive state.

At the beginning of the first cycle of the second operational phase the controllable switch 150 is operated in the conductive state, while the controllable switch 160 is turned in the non-conductive state. Furthermore, the controllable switch 22 is turned in the conductive state. The controllable switches 115 are turned in the off-state so that the storage capacitor 112 is isolated from the potential VRESET. The controllable switches 113 and 114 are turned in the conductive state so that the storage capacitor 112 is connected between the potentiometer 111 and the signal node S20, which is configured as a virtual ground.

The variable programmed reference voltage VCOARSE is used to generate the first crosstalk compensation charge provided by the charging circuit 110. The potentiometer 111 to provide the variable reference voltage VCOARSE is set by the control circuit 30 so that the level of the output signal Vout2, for example an output voltage, is close to the zero level, for example close to 0 V. When the charging circuit 110 additionally comprises the capacitor 112 having a variable capacitance COFFSET, the control circuit 30 may be configured to vary the capacitance COFFSET of the capacitor 112 until the output signal Vout2 approximates the zero level, for example 0 V.

During the subsequent second cycle of the second operational phase fine optical crosstalk compensation is performed by additionally activating the charging circuit 120. The charging circuit 120 may be configured as an offset adjustment circuit of the operational amplifier 130. The charging circuit 120 may be an internal or external offset adjustment circuit of the operational amplifier. The offset voltage VOFFSET of the charging circuit 120 is set by the control circuit 30. The offset voltage VOFFSET or the second charge provided by the charging circuit 120 is set by the control circuit 30 such that the level of the output signal Vout2 approximates closer to the zero level, for example to 0 V, than by means of only using the first charging circuit 110 that provides the coarse crosstalk compensation in the first cycle of the second operational phase.

During the first cycle of the second operational phase the crosstalk voltage Vout1 minus the compensation voltage VCOARSE is transferred to the feedback capacitor 150. During the second cycle of the second operational phase the crosstalk voltage Vout1−(VCOARSE+VOFFSET) is transferred to the integration/feedback capacitor 150. In order to cancel out the complete crosstalk, the first charging circuit 110 and the second charging circuit 120 are controlled by the control circuit 30 such that the sum of the compensation voltages VCOARSE and VOFFSET are set equal to the crosstalk voltage Vout1 so that no crosstalk charge will be transferred into the integration/feedback capacitor 140 anymore.

The amount of compensating crosstalk charge provided by the charging circuit 110 can be adjusted both by the voltage VCOARSE and the variable capacitance COFFSET, if the capacitor 112 is provided with a variable capacitance. The total crosstalk output voltage equivalent corrected with the circuitry shown in FIG. 3 can be given by VCOARSE*COOFFSET/CF, wherein VCOARSE is the compensation voltage set by the potentiometer 111, COFFSET is the variable capacitance of the storage capacitor 112 and CF is the capacitance of the feedback/integration capacitor 140. The total crosstalk output voltage VCOARSE*COFFSET/CF is larger than the maximum output equivalent crosstalk voltage VOFFSET*CS/CF of the circuit configuration shown in FIG. 2. Most of the entire existing crosstalk will be cancelled out by the coarse charging circuit 110 itself. The fine crosstalk cancellation will then be done by using the adjustable offset voltage of the operational amplifier 130 set by the charging circuit/offset adjustment circuit 120.

The coarse cancellation charge equivalent can be generated using a voltage mode circuitry as described with reference to FIG. 3, or using a current mode circuitry with a dynamic programmable current ICOARSE flowing into the signal node/virtual ground node S20 for a clock duration TOFFSET during the first cycle of the second operational phase/integration phase. In comparison the solution shown in FIG. 3, the current mode circuitry is controlled by the control circuit 30 so that ICOARSE*TOFFSET=VCOARSE*COFFSET.

FIG. 4 shows a circuit configuration using a charging circuit 110 being configured as a current mode circuitry comprising a controllable current source 117, for example a dynamic programmable current source, to provide the variable current ICOARSE and a controllable switch 118 that connects the variable current source 117 for a time TOFFSET to the signal node/virtual ground node S20. The amount of the current ICOARSE provided by the current source 117 and/or the time duration TOFFSET during which the controllable switch 118 is operated in the conductive/closed state can be set by the control circuit 30 so that the level of the output signal Vout2 approximates the zero level, for example 0 V during the first cycle of the second operational phase. The fine crosstalk compensation is performed during the second cycle of the second operational phase by means of the second charging circuit/offset adjustment circuit 120 of the operational amplifier 130, as explained above with reference to FIG. 3.

LIST OF REFERENCES 1 proximity sensor
2 target
3 disturbing object
10 transmitting circuit
20 receiving circuit
30 control circuit
40 analog-to-digital converter
50 controllable switch
100 crosstalk compensation circuit
110 charging circuit for coarse crosstalk compensation
120 charging circuit for fine crosstalk compensation
130 operational amplifier
140 feedback/integration capacitor
150 controllable switch
160 controllable switch
170 current mode circuitry for coarse crosstalk compensation
21, 22 controllable switches
23 sampling capacitor
200 detection circuit
300 evaluation circuit
310 integrator circuit

The invention claimed is:

1. A proximity sensor with crosstalk compensation, comprising:
   a transmitting circuit to transmit a signal to be reflected at a target and a disturbing object,
   a receiving circuit to receive a reflected signal having a useful component and a noise component, the useful component caused by the reflection of the signal at the target, the noise component caused by the reflection of the signal at the disturbing object, the receiving circuit comprising an output node to provide an output signal in dependence on the distance of the proximity sensor from the target,
   wherein the receiving circuit comprises a detection circuit to detect the reflected signal and an evaluation circuit having an input side to receive the detected reflected signal and an output side to generate the evaluation signal in dependence on the reflected signal, wherein the receiving circuit comprises a signal node to apply the evaluation signal being generated by the evaluation circuit of the receiving circuit in dependence on the reflected signal, wherein the receiving circuit comprises a crosstalk compensation circuit to generate the output signal, the crosstalk compensation circuit being coupled to the signal node, wherein the crosstalk compensation circuit comprises a first charging circuit to provide a first charge and a second charging circuit to provide a second charge, the first and the second charge being applied to the signal node, a control circuit to control the first and the second charging circuit to set an amount of the first and the second charge so that the output signal of the crosstalk compensation circuit is dependent on the useful component and independent on the noise component of the reflected signal.

2. The proximity sensor of claim 1, wherein the receiving circuit is configured to generate the evaluation signal with a first component being dependent on the useful component of the reflected signal and with a second component being dependent on the noise component of the reflected signal.

3. The proximity sensor of claim 2, wherein the control circuit controls the first and the second charging circuit such that a sum of the amount of the first and the second charge compensates the second component of the evaluation signal, wherein the crosstalk compensation circuit is configured to generate the output signal dependent on the first component of the evaluation signal and independent on the second component of the evaluation signal.

4. The proximity sensor of claim 1, wherein the first charging circuit is configured to provide the amount of the first charge being higher than the amount of the charge provide by the second charging circuit.

5. The proximity sensor of claim 1, wherein the crosstalk compensation circuit comprises an operational amplifier having an input side being coupled to the signal node and an output side being coupled to the output node of the receiving circuit.

6. The proximity sensor of claim 5, wherein the crosstalk compensation circuit comprises a feedback capacitor being disposed in a feedback path between the output side and the input side of the operational amplifier.

7. The proximity sensor of claim 6, wherein the crosstalk compensation circuit comprises a first controllable switch being arranged in the feedback path between the feedback capacitor and the input side of the operational amplifier.

8. The proximity sensor of claim 6, wherein the crosstalk compensation circuit comprises a second controllable switch being arranged in an additional feedback path between the input side and the output side of the operational amplifier.

9. The proximity sensor of claim 1, wherein the first charging circuit comprises a potentiometer and a storage capacitor, wherein the storage capacitor is charged by the amount of the first charge, the amount of the first charge being dependent from the voltage drop set at the potentiometer.

10. The proximity sensor of claim 9, wherein the control circuit is configured to set the voltage drop of the potentiometer.

11. The proximity sensor of claim 9, wherein the storage capacitor has a variable capacitance, wherein the control circuit is configured to set the variable capacitance of the storage capacitor.

12. The proximity sensor of claim 9, wherein the first charging circuit comprises a controllable switch to couple the storage capacitor of the first charging circuit to the signal node.

13. The proximity sensor of claim 1, wherein the first charging circuit comprises a controllable current source and a controllable switch to couple the controllable current source to the signal node, wherein the control circuit is configured to control the controllable current source and/or the controllable switch to set the first charge provided to the signal node.

14. The proximity sensor of claim 1, wherein the second charging circuit is configured as an offset adjustment circuit for the operational amplifier.

15. The proximity sensor of claim 1, wherein the evaluation circuit comprises an integrator circuit having an input side being coupled to the detection circuit to receive the detected reflected signal, wherein the receiving circuit comprises a controllable switch being disposed between the output side of the integrator circuit and the signal node to provide the evaluation signal to the signal node.

* * * * *